(12) United States Patent
Rey et al.

(10) Patent No.: US 6,173,011 B1
(45) Date of Patent: Jan. 9, 2001

(54) FORWARD-BACKWARD CHANNEL INTERPOLATOR

(75) Inventors: Claudio Gustavo Rey, Morgan Hill, CA (US); Ognjen B. Katic, Vancouver (CA)

(73) Assignee: Glenayre Electronics, Inc., Charlotte, NC (US)

( * ) Notice: Under 35 U.S.C. 154(b), the term of this patent shall be extended for 0 days.

(21) Appl. No.: 09/086,205

(22) Filed: May 28, 1998

(51) Int. Cl.[7] .................................................. H03H 7/30
(52) U.S. Cl. ............................................ 375/233; 708/723
(58) Field of Search .................................... 375/229, 232, 375/233, 346, 348; 364/723, 724.011, 724.1, 724.19, 724.2; 708/290, 300, 322, 323

(56) References Cited

U.S. PATENT DOCUMENTS

| | | | |
|---|---|---|---|
| 5,263,053 | * | 11/1993 | Wan et al. ............................... 375/58 |
| 5,337,264 | * | 8/1994 | Levien ............................ 364/724.01 |
| 5,479,922 | * | 1/1996 | Reichl ............................. 364/724.01 |
| 5,513,215 | * | 4/1996 | Marchetto et al. .................... 375/223 |
| 5,553,013 | * | 9/1996 | Davis, Jr. et al. .................... 708/320 |
| 5,592,517 | * | 1/1997 | Camp et al. ......................... 375/350 |
| 5,627,859 | * | 5/1997 | Parr ..................................... 375/229 |
| 5,703,887 | * | 12/1997 | Heegard et al. ....................... 371/42 |
| 5,774,564 | * | 6/1998 | Eguchi et al. ..................... 381/71.11 |
| 5,777,908 | * | 7/1998 | Inogai ................................. 708/313 |
| 5,790,598 | * | 8/1998 | Moreland et al. .................... 375/233 |
| 5,930,296 | * | 7/1999 | Kot ..................................... 375/233 |
| 5,978,823 | * | 11/1999 | Koslov et al. ....................... 708/313 |
| 6,029,264 | * | 2/2000 | Kobayashi et al. ................. 714/755 |

OTHER PUBLICATIONS

Crochiere, R.E. et al., *Multirate Digital Signal Processing, Design of Digital Filters for Decimation and Interpolation*, Prentice–Hall, Inc., pp. 127–131 and 183–185, (1983).

Krauss, T.P., et al., *Signal Processing Toolbox for Use with MATLAB*, The Math Works Inc., pp. 1–16, 1–17, 2–102, (Feb. 1994).

\* cited by examiner

*Primary Examiner*—Chi H. Pham
*Assistant Examiner*—Emmanuel Bayard
(74) *Attorney, Agent, or Firm*—Christensen O'Connor Johnson Kindness PLLC

(57) ABSTRACT

An interpolator having a linear phase response has a first stage implemented with an IIR filter to achieve the narrow transition bandwidth with relatively few filter coefficients. Zero-stuffing and filtering are used to achieve the interpolation. A forward-backward filtering methodology is then used to achieve a linear phase response for the IIR filter. The input sequence to be interpolated is zero stuffed and passed through the IIR filter a first time. Then the time order of the resulting sequence is reversed and then passed through the IIR filter a second time. After that, the resulting output sequence is reversed again. Guard blocks are added to both ends of the input sequence, and then a block of zeros is appended to the zero-stuffed guarded input sequence. The appended zero block causes the startup and ending transient effect of the IIR filter's step response to be equal at both ends, which tends to improve the accuracy of the interpolation. Subsequent zero-stuffing and filtering by FIR filter stages are used to further increase the interpolation. A linear interpolator may also be included after the FIR filter stages.

31 Claims, 4 Drawing Sheets

UNSAMPLED ZERO-STUFFED X(k) WITH
GUARDS AND APPENDED ZEROS

FORWARD-BACKWARD CHANNEL INTERPOLATOR

FIELD OF THE INVENTION

The present invention relates to digital communication systems and, more particularly, to interpolators for use in digital communication systems.

BACKGROUND INFORMATION

Some digital communication systems use equalization to increase accurate detection of transmitted symbols in the presence of intersymbol interference (ISI). Equalization can be used to compensate for this ISI so that the transmitted symbols are accurately detected. Such equalization systems are well known (see for example, U.S. Pat. Nos. 5,414,734 and 5,513,15 for a discussion of equalization). FIG. 1 is a simplified diagram illustrative of a system 10 that uses equalization.

System 10 includes a transmitter 12, a receiver 14 with an equalizer 16. In this example, system 10 is a mobile wireless digital system in which transmitter 12 broadcasts radiofrequency (RF) signals that are modulated to include digital information. In this system, transmitter 12 receives symbols x(t), which transmitter 12 modulates and broadcasts. Each symbol generally represents one or more bits. For example, each symbol of a sixteen-level quadrature amplitude modulation (QAM) scheme represents four bits.

The broadcasted symbol is propagated through a channel 18, which is indicated by a dashed box in FIG. 1. Receiver 14 then receives the broadcasted symbol. Although omitted from FIG. 1 for clarity, in system 10 receiver 14 generally receives a transmission through more than one transmission path. For example, the multiple paths may be the result of more than one transmitter being used to transmit the signals and/or the transmitted signal from a single transmitter being reflected from nearby structures. Typically, the transmission paths between receiver 14 and the various other transmitters are not equal in length and may be changing over time (due to receiver 14 being moved while receiving a symbol), thereby resulting in multipath fading and ISI. Channel 18 represents the multiple paths and can include effects from the transmitter and receiver (e.g., pulse shaping filters, modulation inaccuracies, etc.). Typically, channel 18 is modeled as a time-variant finite impulse response (FIR) filter.

Equalizer 16 compensates for ISI as the ISI changes over time. This compensation allows receiver 14 to more accurately detect the received symbols. The compensation provided by equalizer 16 can be adjusted during operation based on periodically generated estimates of the channel response where the channel is modeled as in system 10.

FIG. 2 is a simplified functional block diagram illustrative of conventional exemplary equalizer 16 (FIG. 1). Equalizer 16 includes a decision feedback equalizer circuit (DFE) 22, a channel estimator 24 and a channel interpolator 26. For example, U.S. Pat. No. 5,513,215 discloses an estimator with a DFE, channel estimator and channel interpolator. The basic operation of exemplary equalizer 16 is as follows. Symbol samples are received by receiver 14 (FIG. 1) and propagated to DFE 22 and channel estimator 24. Channel estimator 24 and channel interpolator 26 operate to periodically provide, in effect, a highly "defined" estimate of the response of channel 18. This interpolated estimate of the channel response allows computation of the coefficients of DFE 22 so that DFE 22 can accurately detect the received symbols.

More specifically, channel estimator 24 uses known pilot symbols that are periodically inserted in the transmitted data sequence. The rate at which the pilot symbols are inserted is related to the highest fading rate that channel estimator 24 can follow. In particular, the frequency of the pilot symbol injection is about two or more times the fading rate that the channel estimator 24 can track (i.e., meeting Nyquist rate constraints). For example, a paging system application adapted for use in a fading environment with a fading rate of about 100 Hz, the pilot symbol insertion rate may be set at about 360 Hz.

Channel interpolator 26 uses the channel estimates from channel estimator 24 to compute the interpolated channel estimates to match the frequency of the received symbols transmitted by transmitter 12 (FIG. 1), or with a higher frequency than the symbol frequency if the receiver uses oversampling techniques. In the aforementioned paging system application, the symbol rate may be about 18 kHz. Thus, the 360 Hz pilot symbol insertion rate requires that channel interpolator 26 interpolate the channel estimates on the order of fifty times. In such cases, high-order interpolators (i.e., fifty or greater) are typically implemented with multistage interpolators to reduce computational load.

FIG. 3 is a block diagram illustrative of multistage channel interpolator 26 (FIG. 2). To get any order of interpolation and a linear phase response of the interpolator, channel interpolator 26 is conventionally implemented using a zero-stuffing technique with filtering through several FIR filter stages $31_1-31_j$ and applying a linear interpolator 53 at the end as a last stage. Linear interpolator 53 is able to implement even the noninteger interpolation values. It can be used as the final stage of interpolation because the earlier FIR filter stages $31_1-31_j$ interpolate the estimated impulse response to well above the Nyquist rate of channel estimator 24, which is determined by the pilot symbol insertion rate. In addition, because the channel fading process is sampled so that the Nyquist rate is close to the fading rate, the first FIR filter stage $31_1$ generally must have a relatively narrow transition bandwidth to filter out noise and prevent aliasing. However, to achieve a narrow transition bandwidth in an FIR filter, a relatively large number of coefficients is required. The large number of coefficients undesirably incurs a relatively large computational load and a relatively large initial filter delay. Accordingly, there is a need for a channel interpolator that has a first stage that provides a narrow transition bandwidth with a linear phase response with fewer filter coefficients.

SUMMARY

In accordance with the present invention, a multistage interpolator is provided having a linear phase response and a first stage with a narrow transition bandwidth. Interpolation is achieved by upsampling the sequence to be interpolated using zero-stuffing techniques and then digitally filtering the sequence. In one aspect of the invention, the first stage is implemented with an infinite impulse response (IIR) filter to achieve the narrow transition bandwidth with relatively few filter coefficients. The smaller IIR filter tends to reduce both the computational load required for the filtering and the guard blocks to avoid the effects of the filter transients.

In another aspect of the present invention, a forward-backward filtering methodology is used to achieve a linear phase response for the IIR filter. In particular, the input sequence to be interpolated is stuffed with zeros according to the order of the interpolation and passed through the IIR filter a first time. Then the time order of the resulting sequence is reversed and then passed through the IIR filter a second time. Finally, the resulting output sequence is reversed again. As a result, the forward-backward filtering achieves a linear phase response.

In yet another aspect of the present invention, a block of zeros is appended to the input sequence so that the startup and ending transient effects of the IIR filter's step response are equal at both ends, which tends to improve the accuracy of the interpolation.

BRIEF DESCRIPTION OF THE DRAWINGS

The foregoing aspects and many of the attendant advantages of this invention will become more readily appreciated by reference to the following detailed description, when taken in conjunction with the accompanying drawings.

DETAILED DESCRIPTION

Figure 4:
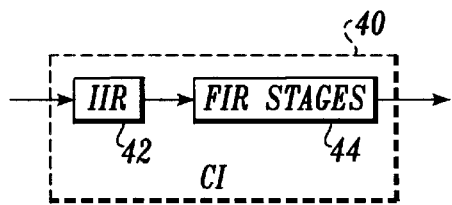
FIG. 4 is a block diagram illustrative of a channel interpolator, according to one embodiment of the present invention.

FIG. 4 is a simplified block diagram illustrative of a channel interpolator 40, according to one embodiment of the present invention. Channel interpolator 40 includes an infinite impulse response (IIR) filter stage 42 and an FIR filter stage section 44. FIR filter stage section 44 includes several cascaded FIR filter stages and may include a linear interpolator stage. As is well known, an IIR filter can achieve a narrow transition bandwidth with fewer coefficients relative to FIR filters. However, IIR filters generally do not have a linear phase response. In accordance with the present invention, a forward-backward filtering methodology is used to achieve a linear phase response with IIR filter 42. The forward-backward methodology is described in more detail below in conjunction with FIG. 5.

Figure 5:
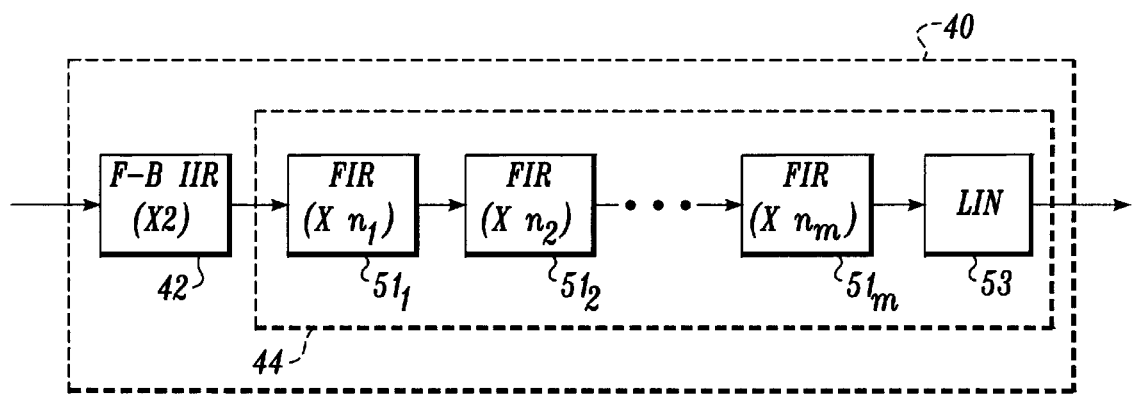
FIG. 5 is a more detailed block diagram of the channel interpolator depicted in FIG. 4.

FIG. 5 is a more detailed block diagram illustrative of channel interpolator 40 (FIG. 4). In this embodiment, IIR filter stage 42 provides interpolation by two (i.e., 2X) using zero-stuffing techniques. As is known in the art of digital filtering, zero-stuffing is a technique in which zeros are inserted between the samples of a sequence to be filtered in a digital filter. As a result, the output sequence of the digital filter has twice as many samples, thereby providing 2X interpolation.

To achieve a linear phase response, the output sequence generated by IIR filter stage 42 is backward filtered through IIR filter stage 42. This backward filtering ideally provides the exact opposite phase response as incurred in the forward direction, thereby achieving linear phase response. To use this forward-backward filtering technique, the received samples are processed on a batch basis. Although forward-backward filtering to linearize phase response is known, the application of forward-backward filtering to an interpolator application is believed to be heretofore unknown.

The output sequence generated by IIR filter stage 42 is then processed by FIR filter stage section 44, which includes FIR filter stages $51_1$–$51_m$ and linear interpolator 53. FIR filter stages $51_1$–$51_m$, respectively, provide $Xn_1$–$Xn_m$ interpolation, where $n_1, n_2, \ldots n_m$ are integers equal to or greater than two. Linear interpolator 53 provides any predetermined order of interpolation, including noninteger values of interpolation if desired. In one embodiment, channel interpolator provides, in total, X100 interpolation with X2 interpolation by forward-backward IIR filter stage 42, two FIR filter stages, each providing X2 interpolation, and linear interpolator 53 providing X12.5 interpolation. Linear interpolator 53 provides a high interpolation with low processing load relative to FIR filter stages providing the same level of interpolation. Linear interpolator 53 does not significantly affect the accuracy of the estimated channel interpolation because the previous FIR filter stages already increase the "sampling" rate to well beyond the Nyquist rate determined by the pilot symbol insertion rate. Although an "X2" IIR filter stage is described, those skilled in the art of digital signal processing can implement IIR filter stage 42 with different orders of interpolation without undue experimentation. For example, IIR filter stage 42 may provide Xm interpolation, where m is an integer greater than two.

Figure 1:
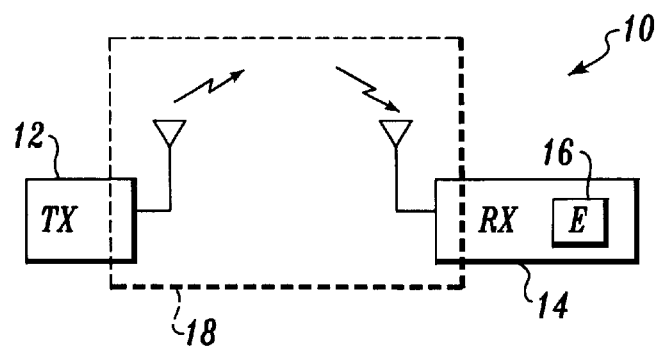
FIG. 1 is a block diagram illustrative of a conventional digital communication system.
Figure 2:
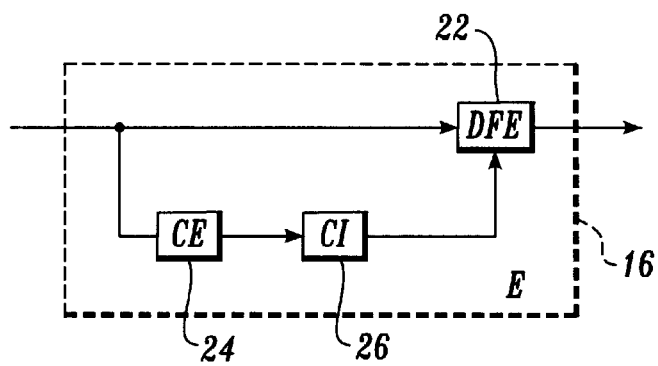
FIG. 2 is a block diagram illustrative of a conventional equalizer for use in a digital communication system.
Figure 3:
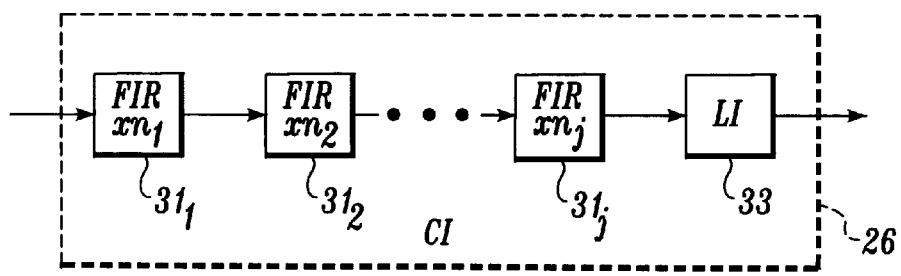
FIG. 3 is a block diagram illustrative of a conventional multistage channel interpolator for use in an equalizer.
Figure 6:
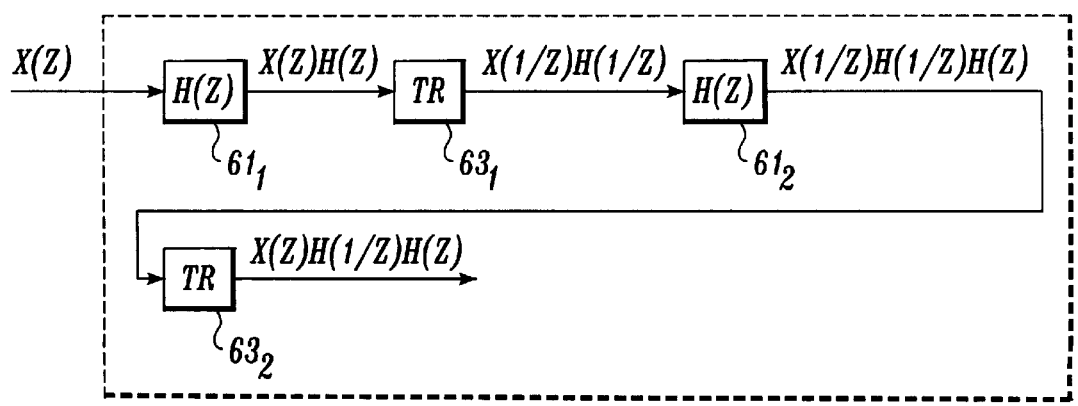
FIG. 6 is a more detailed block diagram illustrative of the IIR filter stage of FIG. 5.

FIG. 6 is a more detailed block diagram illustrative of the processing provided by IIR filter 42 (FIG. 4). In a preferred embodiment, IIR filter stage 42 is implemented using a digital signal processor (DSP) and associated memory. In light of this disclosure, those skilled in the art can design and build a program to be executed by the DSP to implement IIR filter stage 42 without undue experimentation. In one embodiment, a model 1620 DSP available from Lucent Technologies is used, with the program implementing IIR filter stage 42 stored in the DSP's on-chip nonvolatile memory. The input sequence of channel estimates from channel estimator 24 (FIG. 2) is received by IIR filter stage 42 (FIG. 5). The input sequence is then stuffed with zeros. The input sequence is represented in the z-domain by X(z). The transfer function of IIR filter stage 42 (FIG. 5) is represented by H(z). Thus, in the forward pass, the input sequence X(z) is operated on by H(z) block $61_1$, resulting in an output sequence X(z)H(z).

This output sequence is received by a time reversal block $63^1$, which reverses the output sequence from H(z) block $61_1$, generating an output sequence X(1/z)H(1/z). As is well known, time reversal of the sequence X(z)H(z) is represented in the z-domain as X(1/z)H(1/z). Then this sequence is filtered again by IIR filter stage 42 (FIG. 5) as represented by H(z) block $61_2$, thereby performing the backward filtering to achieve linear phase response. The resulting sequence is represented by X(1/z)H(1/z)H(z). Ihis sequence is then time reversed again by time reversal block $63_2$, resulting in an output sequence X(z)H(1/z)H(z). This sequence is then processed by FIR filter stage section 44 (FIG. 5) to provide further interpolation.

Figure 7A:
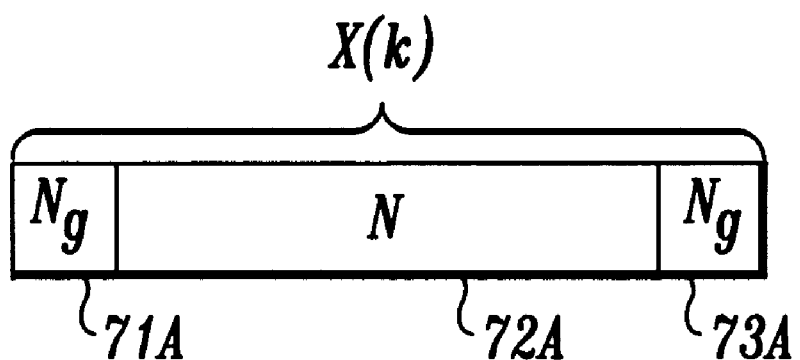
FIG. 7A is a diagram illustrative of a block of guarded channel estimates, according to one embodiment of the present invention.

FIG. 7A is a diagram illustrative of a block of guarded channel estimates, according to one embodiment of the present invention. The use of guard sequences or guards improves the accuracy of interpolation by avoiding the effect of transients in the filter output sequence. As shown in FIG. 7A, the forward filtering is started with a predetermined number $N_g$ of guard samples 71A, followed by the sequence of estimated channel coefficients 72A. The number of estimated channel coefficients 72A is indicated by N. In a preferred embodiment, $N_g$ is predetermined to be about equal to one-half of the transient length of the IIR filter response so that after zero-stuffing the guard is equal to the transient. In this embodiment, $N_g$ is determined as one-half of the number of output samples required for the impulse response of IIR filter $61_1$ (FIG. 6) to decay to about one percent of its maximum value. In one embodiment for use in a paging system application, N is equal to twenty, and $N_g$ is equal to seven.

In addition, the backward filtering should also be started with $N_g$ (i.e., seven) guard samples. The backward filtering guards are provided by appending $N_g$ guard samples to the N estimated channel coefficients. Thus, the input sequence includes trailing guards 73A, which, after the forward pass through IIR filter stage 42 (FIG. 5), become the leading guards in the backward pass.

Figure 7B:
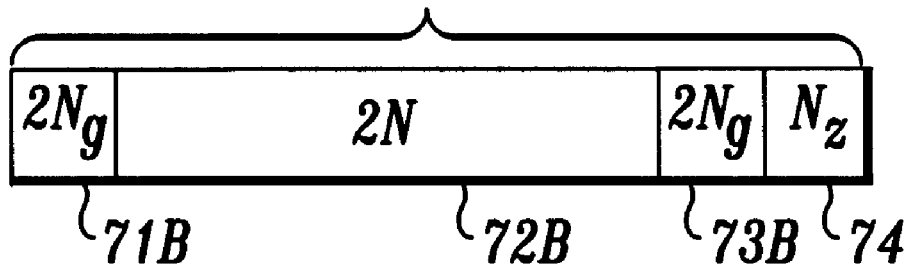
FIG. 7B is a diagram illustrative of a block of upsampled guarded zero-stuffed channel estimates with appended zeros.

FIG. 7B shows a further refinement, where a zero block 74 having a predetermined number $N_z$ of zeros is appended to the zero-stuffed input sequence to improve accuracy. More specifically, the forward and backward IIR filtering effectively doubles the transient effects of the combined impulse response. Rather than increase the length of the end guard, the zeros are appended to capture the transient beyond the guard, thereby allowing the backward filtering to be more accurate. Preferably, the number $N_z$ is set to be about equal to the transient length of IIR filter $61_1$ (FIG. 6).

Figure 8:
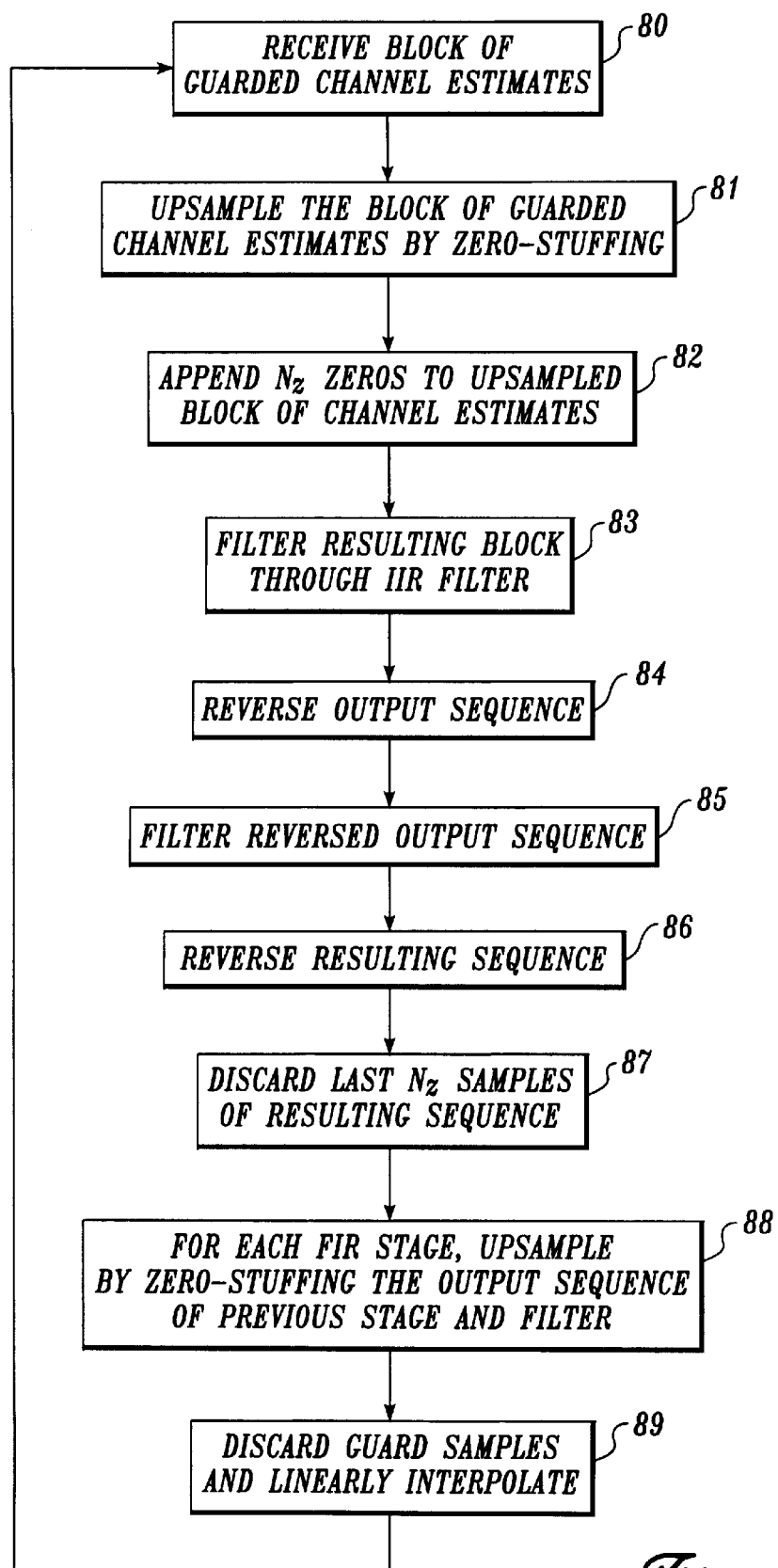
FIG. 8 is a flow diagram illustrative of the operation of a channel interpolator, according to one embodiment of the present invention.

FIG. 8 is a flow diagram illustrative of the operation of a channel interpolator, according to one embodiment of the present invention. IIR filter $61_1$ (FIG. 6) has been designed to achieve the desired transient bandwidth and cutoff frequency and the transient length $N_t$ has been determined. The cutoff frequency corresponds to the fading rate. As described above, preferably, $N_t$ is the distance in samples from the coordinate start to where the impulse response decays to about one percent of its maximum value.

Referring to FIGS. 5, 6, 7A, 7B, and 8, IIR filter stage 42 operates as follows. In a step 80, IIR filter stage 42 receives a sequence of channel estimates. This sequence of channel estimates includes guard samples 71A and 73A (each having $N_g$ samples) on both ends of the sequence of estimated channel coefficients 72A (having N coefficients). This block of concatenated guards and estimated coefficients is referred to herein as a guarded block of channel estimates.

In a step 81, the guarded block of channel estimates is upsampled to 2X by zero-stuffing. Then, in a step 82, zero block 74 (having $N_z$ zeros) is appended to the upsampled block of guarded channel estimates and in a step 83 is filtered by IIR filter $61_1$. In a next step 84, the time order of the output sequence generated in step 83 is reversed by the reversal block $63_1$. Then, in a step 85, the reversed sequence generated in step 84 is filtered again by IIR filter $61_2$. The time order of the output sequence resulting from step 85 is reversed again by time reversal block $63_2$ in a step 86. Then in a step 87, the last $N_z$ samples of the resulting output sequence are discarded.

Additional steps 88 and 89 are included to illustrate the interpolation provided by FIR filter stage section 44 (FIG. 5). In step 88, for each FIR filter stage, the sequence outputted by the previous filter stage is upsampled by zero-stuffing and then filtered by the FIR filter stage. These FIR filtering steps can also be performed by the aforementioned DSP. Then in step 88, the interpolated $N_g \cdot 2 \cdot n_1 \cdot n_2 \cdots n_m$ guard samples at both ends of the sequence outputted by FIR filter stage $51_m$ are discarded and the resulting sequence is linearly interpolated by linear interpolator 53 using a standard linear interpolation algorithm.

The embodiments of the interpolator circuit described above are illustrative of the principles of the present invention and are not intended to limit the invention to the particular embodiments described. For example, in light of the present disclosure, those skilled in the art can devise implementations of FIR filter stage section 44 other than the embodiment described. In addition, different DSPs or general-purpose processors may be used instead of the particular DSP described. Still further, other embodiments of the present invention may use different numbers of guard samples and appended zeros, or different numbers of taps in the digital filters. In yet another embodiment, the interpolator circuit may be implemented as a multirate system in which interpolation and decimation by integer values may be used to achieve noninteger interpolation (e.g., interpolation stages to achieve X11 interpolation combined with X2 decimation, thereby achieving X5.5 interpolation). Accordingly, while the preferred embodiment of the invention has been illustrated and described, it will be appreciated that various changes can be made therein without departing from the spirit and scope of the invention.

We claim:

1. A method of interpolating a channel response, the channel response being a sequence of values, the method comprising:
   receiving the channel response;
   concatenating a first guard block to one end of the channel response;
   concatenating a second guard block to another end of the channel response;
   upsampling the concatenated channel response and guard blocks to form an upsampled guarded channel response;
   filtering the upsampled guarded channel response using an infinite impulse response (IIR) filter to generate a forward output sequence;
   reversing the order of the forward output sequence to form a reversed forward output sequence;
   filtering the reversed forward output sequence through the IIR filter to generate a backward output sequence; and
   reversing the order of the backward output sequence to form a forward-backward IIR filter output sequence.

2. The method of claim 1 wherein a zero-stuffing technique is used to upsample the concatenated channel response and guard blocks.

3. The method of claim 1 wherein the first and second guard blocks are each a sequence of $N_g$ samples, $N_g$ being an integer greater than zero.

4. The method of claim 3 further comprising appending a block of $N_z$ zeros to the upsampled guarded channel response before filtering through the IIR filter to generate the forward output sequence, $N_z$ being an integer greater than one.

5. The method of claim 4 wherein $N_g$ is about equal to one-half of a transient length of the IIR filter, and wherein $N_z$ is about equal to the transient length of the IIR filter.

6. The method of claim 4 further comprising discarding the last $N_z$ samples of the backward output sequence to form an IIR stage output sequence.

7. The method of claim 5 further comprising filtering the IIR stage output sequence through an FIR filter section to form an FIR section output sequence.

8. The method of claim 7 further comprising discarding the interpolated guard blocks of the FIR section output sequence.

9. The method of claim 7 wherein the FIR filter section includes a plurality of FIR filter stages, wherein for each FIR filter stage, the output sequence of the previous filter stage is upsampled and then filtered.

10. The method of claim 7 wherein the FIR filter section further includes a linear interpolator.

11. An interpolator for interpolating a channel response, the channel response being a sequence of samples, the interpolator comprising:
    means for receiving the channel response;
    means for concatenating a first guard block to one end of the channel response;
    means for concatenating a second guard block to another end of the channel response;
    means for upsampling the concatenated channel response and guard blocks to form an upsampled guarded channel response; and
    an infinite impulse response (IIR) filter section with an IIR filter, wherein the IIR filter section is configured to:
        filter the upsampled guarded channel response through the IIR filter to generate a forward output sequence;
        reverse the order of the forward output sequence to from a reversed forward output sequence;
        filter the reversed forward output sequence through the IIR filter to generate a backward output sequence; and
        reverse the order of the backward output sequence to generate a forward-backward IIR filter output sequence.

12. The interpolator of claim 11 wherein the IIR filter section is configured to use a zero-stuffing technique to upsample the concatenated channel response and guard blocks.

13. The interpolator of claim 11 wherein the first and second guard blocks are each a sequence of $N_g$ samples, $N_g$ being an integer greater than zero.

14. The interpolator of claim 13 wherein the IIR filter section is further configured to append a block of $N_z$ zeros to the upsampled guarded channel response before filtering through the IIR filter, $N_z$ being an integer greater than one.

15. The interpolator of claim 14 wherein $N_g$ is about equal to one-half of a transient length of the IIR filter, and wherein $N_z$ is about equal to the transient length of the IIR filter.

16. The interpolator of claim 14 wherein the IIR filter section is further configured to discard the last $N_z$ samples of the backward output sequence to form an IIR section output sequence.

17. The interpolator of claim 15 further comprising an FIR filter section having an FIR filter circuit, the FIR filter section being coupled to the IIR filter section, wherein the FIR filter section is configured to filter the IIR section output sequence through the FIR filter circuit to form an FIR section output sequence.

18. The interpolator of claim 17 wherein the FIR filter section is further configured to discard the interpolated guard blocks of the FIR section output sequence.

19. The interpolator of claim 17 wherein the FIR filter circuit includes a plurality of FIR filter stages, wherein for each FIR filter stage, the output sequence of the previous filter stage is upsampled and then filtered.

20. The interpolator of claim 17 wherein the FIR filter section further includes a linear interpolator coupled to the FIR filter circuit.

21. The interpolator of claim 11 wherein a digital signal processor is used to implement the interpolator.

22. A channel interpolator for use in an equalizer in interpolating a channel response, the channel response being a sequence of samples, the channel interpolator comprising:
    an IIR filter section, wherein the IIR filter section is configured to:
        receive the channel response,
        concatenate a first guard block to one end of the channel response and concatenate a second guard block to another end of the channel response to form a guarded channel response,
        upsample the guarded channel response to form an upsampled guarded channel response,
        filter the upsampled guarded channel response through the IIR filter to generate a forward output sequence,
        reverse the order of the forward output sequence to form a reversed forward output sequence;
        filter the reversed forward output sequence through the IIR filter to generate a backward output sequence; and
        reverse the order of the backward output sequence to generate a forward-backward output sequence; and
    an FIR filter section configured to filter the forward-backward output sequence using an FIR filter.

23. The channel interpolator of claim 22 wherein the IIR filter section is configured to use a zero-stuffing technique to upsamlpe the guarded channel response.

24. The channel interpolator of claim 22 wherein the first and second guard blocks are each a sequence fo $N_g$ samples, $N_g$ being an integer greater than zero.

25. The channel interpolator of claim 24 further comprising appending a block of $N_z$ zeros to the upsampled guarded channel response before filtering through the IIR filter to generate the forward output sequence, $N_z$ being an integer greater than one.

26. The channel interpolator of claim 25 wherein $N_g$ is about equal to one-half of a transient length of the IIR filter, and wherein $N_z$ is about equal to the transient lenght of the IIR filter.

27. The channel interpolator of claim 25 wherein the IIR filter section is further configured to discard the last $N_z$ samples of the backward output sequence to form an IIR section output sequence.

28. The channel interpolator of claim 26 the FIR filter section is further configured to filter the IIR section output sequence through an FIR filter to form an FIR section output sequence.

29. The channel interpolator of claim 28 wherein the FIR filter section is further configured to discard the interpolated guard blocks of the FIR section output sequence.

30. The channel interpolator of claim 28 wherein the FIR filter is a miltistage FIR filter, each FIR filter stage of the FIR filter being configured to receive and upsamped received output sequence.

31. The channel interpolator of claim 28 wherein the FIR filter section further includes a linear interpolator coupled to the FIR filter.

* * * * *

UNITED STATES PATENT AND TRADEMARK OFFICE
CERTIFICATE OF CORRECTION

PATENT NO.    : 6,173,011 B1
DATED         : January 9, 2001
INVENTOR(S)   : C. G. Rey et al.

It is certified that error appears in the above-identified patent and that said Letters Patent is hereby corrected as shown below:

<u>Column 8,</u>
Line 32, "upsamlpe" should read -- upsample --
Line 43, "lenght" should read -- length --
Line 49, "26 the" should read -- 26 wherein the --
Line 57, "miltistage" should read -- multistage --
Line 58, "and upsampled received output sequence." should read -- and upsample an output sequence received from a previous filter stage and then filter the upsampled received output sequence. --

Signed and Sealed this

Seventh Day of January, 2003

JAMES E. ROGAN
*Director of the United States Patent and Trademark Office*